United States Patent [19]

Hasegawa et al.

[11] Patent Number: 5,667,622

[45] Date of Patent: Sep. 16, 1997

[54] IN-SITU WAFER TEMPERATURE CONTROL APPARATUS FOR SINGLE WAFER TOOLS

[75] Inventors: Isahiro Hasegawa, Stormville; Karl Paul Muller, Wappingers Falls; Bernhard L. Poschenriedes, Poughkeepsie; Hans-Joerg Timme, Wappingers Falls; Theodore Van Kessel, Millbrook, all of N.Y.

[73] Assignees: Siemens Aktiengesellschaft, Munich, Germany; International Business Machines Corporation, Armonk, N.Y.; Kabushiki Kaisha Toshiba, Kanagawa-Ken, Japan

[21] Appl. No.: 519,373

[22] Filed: Aug. 25, 1995

[51] Int. Cl.$^6$ .................................................. H01L 21/00
[52] U.S. Cl. ................................................ 156/345; 438/5
[58] Field of Search ........................ 156/345, 345 MC, 156/345 P, 345 V, 626.1, 662.1, 657.1, 627.1, 646.1, 643.1; 204/298.31, 298.32, 298.34

[56] References Cited

U.S. PATENT DOCUMENTS

| | | | |
|---|---|---|---|
| 4,493,939 | 1/1985 | Blaske et al. | 136/212 |
| 5,179,333 | 1/1993 | Washizuka et al. | 324/158 |
| 5,270,266 | 12/1993 | Hirano et al. | 437/228 |
| 5,374,888 | 12/1994 | Karasawa | 324/765 |

*Primary Examiner*—William Powell
*Attorney, Agent, or Firm*—Donald B. Paschburg

[57] ABSTRACT

A temperature control apparatus for single wafer etching tools comprising a cathode electrode, an isolation layer, and chuck means, respectfully, which are vertically stacked to support a wafer to be etched. A layer of thermoelectric elements is disposed between the isolation layer and the chuck means. The layer of thermoelectric elements comprises a center area closed loop of connected Peltier elements and an outer area closed loop of connected Peltier elements. The center area closed loop is coupled to a power source and is arranged to correspond to the center area of the wafer. The outer area closed loop is coupled to a power source and is arranged to correspond to the outer area of the wafer. Accordingly, the temperatures associated with each of the specific areas of the wafer are individually controlled by one of the closed loops.

20 Claims, 4 Drawing Sheets

IN-SITU WAFER TEMPERATURE CONTROL APPARATUS FOR SINGLE WAFER TOOLS

FIELD OF THE INVENTION

The present invention relates to a semiconductor wafer etching tool, and more particularly, to an apparatus for controlling the temperature of a semiconductor wafer during etching.

BACKGROUND OF THE INVENTION

In dry etch processes for semiconductor wafers, wafer surface temperature is a critical process parameter. Even minor fluctuations in wafer temperature during processing can effect the characteristics of the etched wafer, such as etch rate, taper angle of etched features, and sidewall deposition rate. Accordingly, it is desirable to provide local temperature uniformity during such processing. One method of temperature control during processing is obtained by feeding a fluid from a reservoir through a feeding line built within a chuck on which the wafer is suspended during processing. The temperature of the fluid is measured and controlled in the reservoir and is pumped through the chuck. Accordingly, the temperature of the chuck surface is determined by the set temperature of the reservoir and isolation losses in the coolant lines. However, this method for controlling temperature is very limited. For example, different temperatures across the chuck surface cannot be compensated for or controlled. In fact, this problem escalates as the wafer diameter increases. Furthermore, this method has a very long response time (approximately 2 minutes per degree).

Another method of controlling temperature during processing is obtained by improving the heat transfer characteristics between the wafer and the chuck through backfilling (introducing helium or a similar gas into the interstices between the wafer and a susceptor to increase the heat exchanging rate between them). This procedure is described in detail in U.S. Pat. No. 5,270,266 to Hirano et at., issued on Dec. 14, 1993. Thus, by varying the pressure of the gas introduced, the temperature of the wafer can be moderately controlled.

However, methods of controlling wafer temperature by locally applying different pressures via Helium backfilling is limited to simple geometries (center versus edge). Additionally, such methods are restricted to electrostatic chucks only.

A further method of controlling wafer temperature during processing is to fabricate a thermoelectric device having an array of thermocouples which operate using the Peltier effect (the absorption of heat at a junction through which an electric current flows). For example, U.S. Pat. No. 4,493,939 to Blaske et al., issued on Jan. 15, 1985, discloses a method and apparatus for manufacturing a thermoelectric device comprising a matrix member which is fabricated from an array of thermoelectric elements. However, this patent does not indicate how to use the described array of thermoelectric elements in conjunction with a wafer for controlling the temperature of the wafer.

Accordingly, it is the object of the present invention to substantially overcome or eliminate such disadvantages by providing an apparatus for sensing and controlling the local temperature distribution of a semiconductor wafer during processing that is quicker in response time and provides superior localized temperature control as compared to those of the prior art.

SUMMARY OF THE INVENTION

The present invention is a temperature control apparatus for single wafer etching tools. The In-Situ Wafer Temperature Control apparatus for single wafer tools comprises a cathode, an isolation layer, a layer of thermoelectric elements, and chuck means, respectfully, which are vertically stacked to support a wafer to be etched. The layer of thermoelectric elements comprises a plurality of thermoelectric elements which are connected in a predetermined configuration to form a plurality of closed loops. Specifically, each of the closed loops of thermoelectric elements comprises a predetermined number of Peltier elements interconnected with a power means and corresponding to a specific area of the wafer. Thus, the temperatures at the specific areas of the wafer can be controlled by powering a specific closed loop.

BRIEF DESCRIPTION OF THE DRAWINGS

The foregoing and other objects, features, and advantages of the invention will be apparent from the following more particular description of the preferred embodiments of the invention, as illustrated in the accompanying drawings, wherein.

DETAILED DESCRIPTION OF THE DRAWINGS

Figure 1:
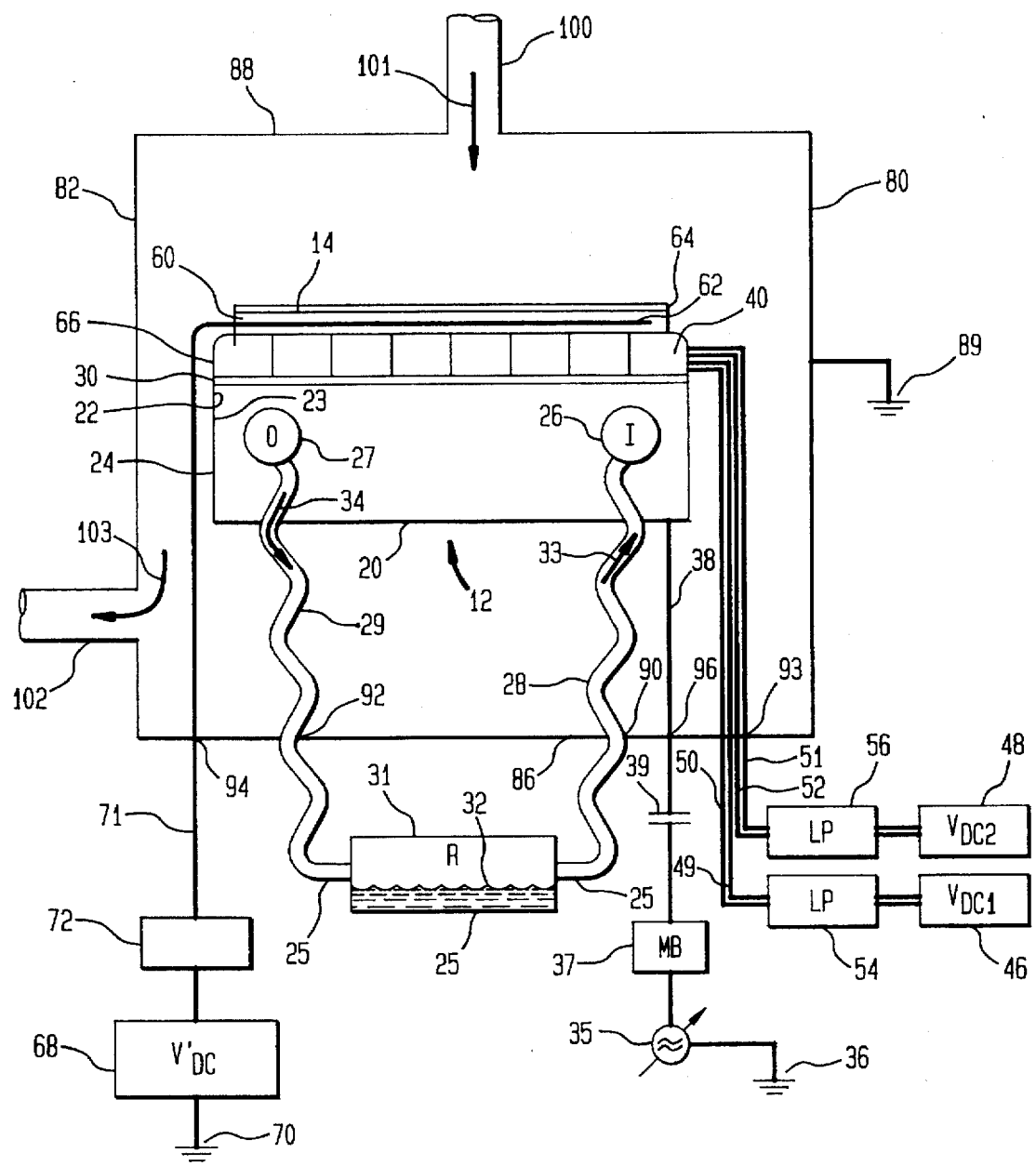
FIG. 1 is a front view schematic of an exemplary embodiment of the present invention.

Referring to FIG. 1, the present invention is shown comprising a reduced-pressure chamber 80 for providing an etching environment and a single wafer support 12 disposed within the chamber 80.

The chamber 80 of the present invention is cylindrical in shape. However, it should be understood that the chamber 80 can comprise any shape, such as cubical. Generally, the chamber 80 includes a top surface 88, a bottom surface 86, and a continuous side wall 82. Extending from the top surface 88 of the chamber 80 is an input pipe 100 for supplying an etching gas into the chamber 80. Extending from the side wall 82 of the chamber 80 is an output pipe 102 for removing gas from the chamber. Finally, the side wall 82 of the chamber 80 is connected to ground 89.

The chamber 80 of the present invention is fabricated from a conductive metal, such as Aluminum. However, it should be understood that the chamber 80 can be fabricated from any conductive material known in the art capable of maintaining a reduced-pressure environment.

Disposed within the chamber 80 is a wafer support 12. Specifically, the support 12 comprises a cathode electrode 20, a dielectric isolation layer 30, a layer of thermoelectric elements 40, and chuck means 60. The layers of the support 20, 30, 40, 60 are designed in size and shape to support the wafer 14. In the exemplary embodiment shown in FIG. 1, each of the layers 20, 30, 40, 60 of the support 12 have a diameter of approximately 200 mm, which is the diameter of the wafer 14. However, it should be understood that the size and shape of the layers 20, 30, 40, 60 of the support 12 can be varied to accommodate a wafer 14 of any size or shape.

The cathode electrode 20 forms the bottom layer of the support 12 and comprises a top surface 22, a bottom surface 24, and an outer side 23. The cathode electrode 20 is fabricated from a metal block and provides support for the isolation layer 30, the layer of thermoelectric elements 40, and the chuck means 60.

Formed within the cathode electrode 20 is a through-hole (not shown) which forms part of a closed loop cooling line 25 for cooling the wafer 14. The cooling line 25 includes the through hole, an input port 26, an output port 27, an input pipe 28, an output pipe 29, and a reservoir 31. It should be understood that the input pipe 28 and output pipe 29 are not restricted to the serpentine configuration shown.

Generally, a coolant 32 such as water is contained in the reservoir 31 which is located outside of the chamber 80. The coolant 32 is pumped (as shown by arrow 33) through the serpentine input pipe 28, which extends into the chamber 80 through an aperture 90 in the bottom surface 86 of the chamber 80, and into the cathode electrode 20 via the input port 26. The coolant 32 is then circulated through the through-hole to control the temperature associated with the support 12. The circulated coolant 32 then exits the cathode electrode 20 (as shown by arrow 34) through the serpentine output pipe 29, which extends through an aperture 92 in the bottom surface 86 of the chamber 80 via the output port 27. Finally, the coolant 32 is circulated through the reservoir 31, and the process is repeated. It should be understood that the cooling line 25 described herein is not limited to the configuration shown. Additionally, the coolant 32 can comprise any substance capable of reducing the temperature of the etching tool support 12.

The cathode electrode 20 is capacitively coupled to an RF power source 35 via a coupling capacitor 39 and a match box 37 housing a variable coupling capacitor (not shown). Specifically, a 13.56 MHz power source 35 is capacitively coupled to the cathode electrode 20 via a coaxial cable 38 or similar coupling means, which extends from the RF power source 35 through a feed through 96 in the bottom surface 86 of the chamber 80 and to the cathode electrode 20. One terminal of the power source 35 is connected to ground 36. It should be understood that although a frequency of 13.56 MHz or multiples thereof provides the least amount of interference with radio operations, other frequencies can be employed, depending upon the system parameters.

Disposed on the top surface 22 of the cathode electrode 20 is a dielectric isolation layer 30. The isolation layer 30 can be fabricated from any material known in the art for dielectrically isolating the layer of thermoelectric elements 40 from the cathode electrode 20.

Disposed above the isolation layer 30 is a layer of thermoelectric elements 40 for locally cooling down or heating up the wafer 14. Specifically, the layer of thermoelectric elements 40 can operate under the Peltier Effect (heat is absorbed or generated at the junctions through which an electric current flows) or under the Seebeck Effect (temperature is measured at the junctions through which an electric current flows). It should be understood, however, that the present invention is not limited to the elements described herein.

Figure 2:
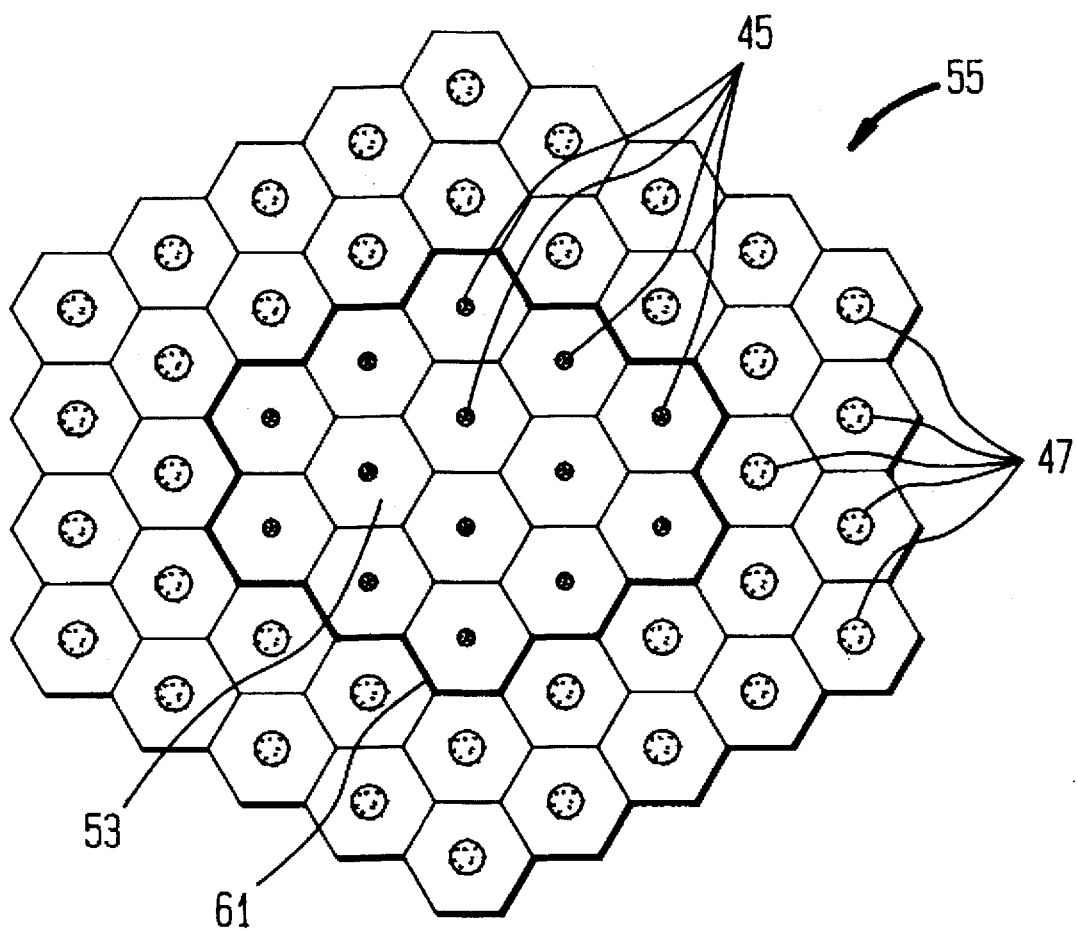
FIG. 2 is a transparent plan view schematic of the layer of thermoelectric elements shown in FIG. 1.

Referring to FIG. 2, fourteen closely packed hexagon shaped Peltier elements 45 (indicated by small bullets) are shown comprising a center area closed loop 53. Similarly, thirty-eight closely packed hexagon shaped Peltier elements 47 (indicated by large bullets) are shown comprising an outer area closed loop 55. The center area closed loop 53 and the outer area closed loop 55 are isolated via an insulation layer 61.

The Peltier elements 45, 47 are selected and arranged to provide localized temperature control of each region of the wafer 14. However, it should be understood that the number, shape, and size of the Peltier elements 45, 47 can be varied, bearing in mind that localized temperature control is improved by utilizing a greater number of closely packed, smaller Peltier elements.

Figure 3:
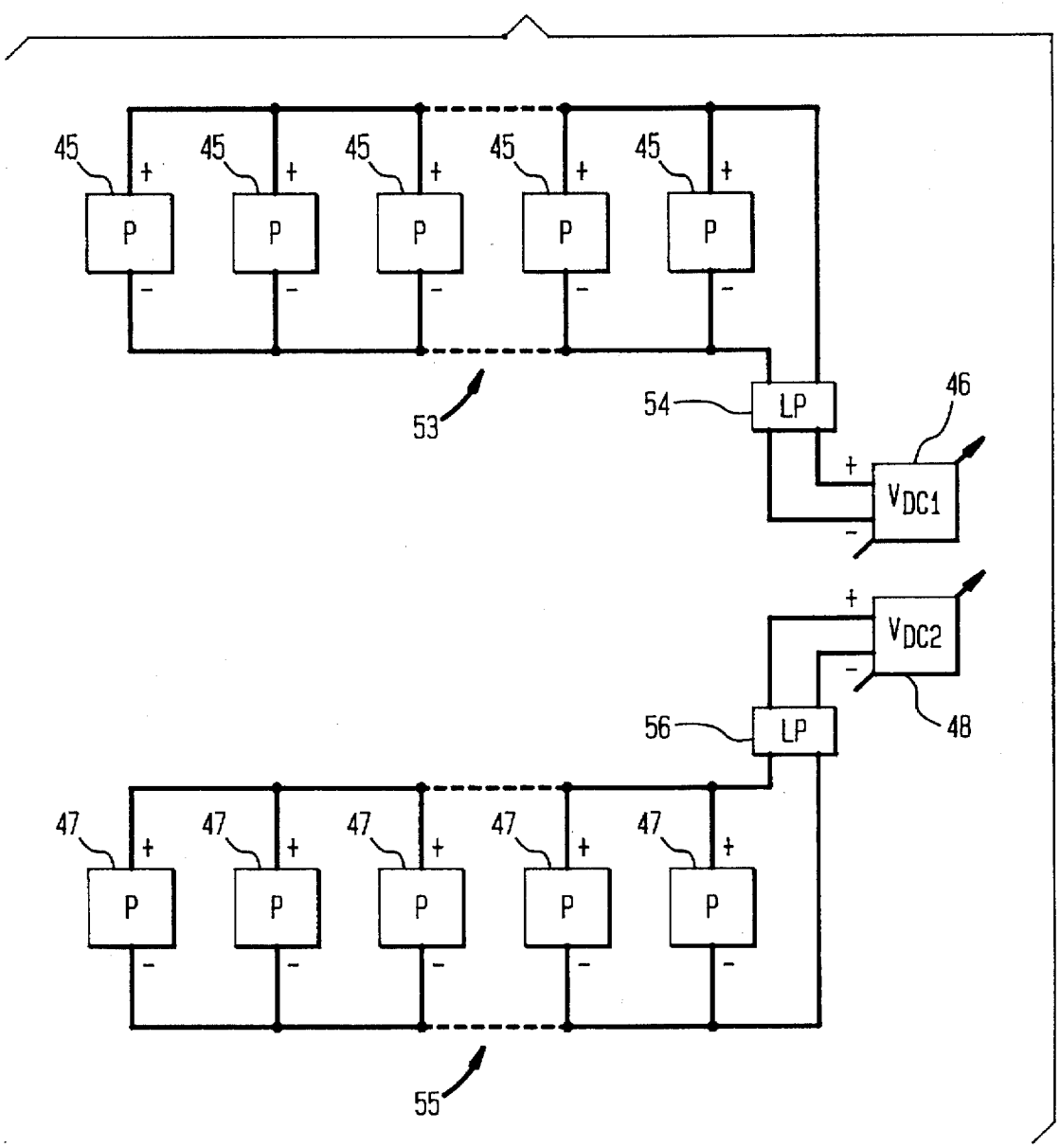
FIG. 3 is a schematic diagram illustrating/he connection of the Peltier elements with a power source.

Referring to FIG. 3, the Peltier elements 45, 47 of each closed loop 53, 55 are connected in parallel with a first and second DC power source 46, 48, respectively. Specifically, a voltage ($V_{DC1}$) is applied across each of the Peltier elements 45 comprising the center area closed loop 53, and the voltage ($V_{DC2}$) is applied across each of the Peltier elements 47 comprising the outer area closed loop 55.

Referring to FIG. 1, power is supplied from the first DC power source 46 and the second DC power source 48, which are located outside of the chamber 80, to the center area closed loop 53 and the outer area closed loop 55, via a first pair of feeds 49, 50 and a second pair of feeds 51, 52, respectfully, which extend into the chamber 80 through a feed through 93 in the bottom surface 86 of the chamber 80. In addition, the first pair of feeds 49, 50 and the second pair of feeds 51, 52 extend through a first low pass filter 54 and a second low pass filter 56, respectively.

The multi-loop configuration described herein provides superior temperature control as compared to those temperature control devices of the prior art. However, it should be understood that the present invention is not limited to the center area loop 53 and the outer area loop 55 described herein. The number and configuration of the loops can be varied to address specific temperature control problems encountered during etching, bearing in mind that a greater number of smaller sized loops provides greater localized temperature control. Further, the present invention is not limited to the power supply and feed configurations described herein; the closed loops can be arranged in any manner for locally controlling the temperature of specific areas of the wafer 14.

Figure 4:
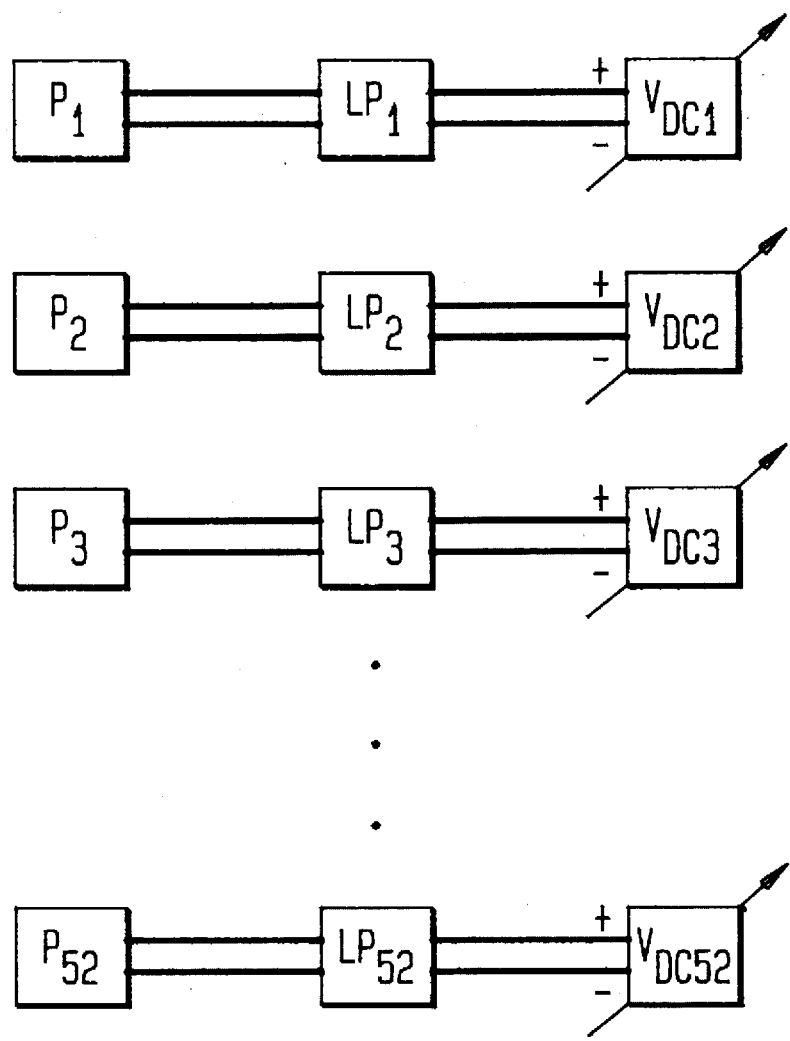
FIG. 4 is a schematic diagram illustrating the coupling of each of the Peltier elements with a corresponding power source.

For example, an embodiment comprising 52 closed loops is shown in FIG. 4. In this embodiment, each one of the Peltier elements $P_1-P_{52}$ is coupled to a corresponding DC power source $V_{DC1}-V_{DC52}$ and a corresponding low pass filter $LP_1-LP_{52}$ to form a closed loop. Accordingly, such a configuration provides greater localized temperature control as compared to those embodiments comprising a fewer number of closed loops.

Disposed on each of the Peltier elements 45, 47 is a temperature sensing means (not shown), such as a thermocouple, which provides localized temperature sensing at each respective Peltier element 45, 47. However, the temperature sensing means is not limited to a thermocouple, and can comprise any means for sensing temperature, such as an RTD or a thermistor.

Disposed above the layer of Peltier elements 40 is the chuck means 60 for supporting the wafer 14. Generally, an electrostatic chuck 60 of the type that draws and holds the wafer 14 via Coulomb force is provided. A conductive layer 62, such as Copper, is interposed between a first insulating sheet 64 and a second insulating sheet 66, such as polyimides, to form the electrostatic chuck 60. It should be understood that the chuck means 60 of the present invention is not limited to the electrostatic chuck 60 disclosed herein; any means for supporting the wafer 14 can be utilized, such as a mechanical chuck or a vacuum chuck.

The electrostatic chuck 60 supplies high voltage ($V'_{DC}$) to the conductive layer 62 by way of a 2 KV DC power source 68 which is located outside of the chamber 80. One terminal of the power source 68 is connected to ground 70. Power is fed to the conductive layer 62 through a feed 71 which extends from the power source 68 and through a low pass filter 72 to the conductive layer 62. The feed 71 extends into the chamber 80 through a feed through 94 in the bottom surface 86 of the chamber 80. It should be understood, however, that the power source 68 supplying the chuck 60 is not limited to the 2 KV DC source 68 described herein, and can include any power means.

Upon powering of the chuck 60 via the DC power source 68, the wafer 14 is drawn to the chuck 60 by the electrostatic forces provided. If the surfaces of the wafer 14 are uneven, a plurality of interstices (not shown) may form between the top polyimide layer 64 of the chuck 60 and the wafer 14. These interstices lower the heat exchanging efficiency between the chuck 60 and the wafer 14, which causes the temperature distribution all over the wafer 14 to become non-uniform. In order to reduce these heat exchange losses and to improve the heat transfer characteristics between the wafer 14 and the chuck 60, the interstices can be filled via conventional backfilling techniques, which are well known in the art. Although the backfilling techniques of the present invention use Helium gas, it should be understood that any gas which increases the heat transfer characteristics between the wafer 14 and the chuck 60 can be utilized.

Once the wafer 14 is secured to the chuck 60, an etching gas such as Hydrogen Bromine or Nitrogen Tetrafluoride is introduced into the chamber 80 (as shown by arrow 101) via the input pipe 100, which extends from the top surface 88 of the chamber 80. High frequency power is supplied from the RF power source 35 to between the top surface 88 of the chamber 80, which serves as an upper electrode, and the cathode electrode 20, and a magnetic field is generated therebetween. As a result, a volume of plasma (not shown) comprising among others ions and free radicals is generated.

Excess gas and volatile etch products are then pumped out of the chamber 80 (as shown by arrow 103) through the output pipe 102, which extends from the side wall 82 of the chamber 80, via a vacuum pump (not shown) which is located outside of the chamber 80.

Accordingly, the Peltier elements 45, 47 can be forced to locally cool down or to locally heat up specific areas of the wafer 14 during the etching process. For example, a controller can be provided (not shown) to compare a sensed local temperature with a given setpoint or reference temperature, such as the mean temperature value of all the Peltier elements 45, 47. Upon indication of a temperature that exceeds a predetermined value, any of the closed loops 53, 55 can be energized to cool down or heat up specific areas of the wafer 14.

In another embodiment (not shown), each of the Peltier elements 45, 47 can function as a temperature sensor by operating under the Seebeck effect (the generation of an electromotive force by a temperature difference between the junctions in a circuit composed of two homogeneous electric conductors of dissimilar composition). By periodically interrupting the current through the Peltier elements 45, 47, the thermovoltage across the Pettier elements 45, 47 can be measured. If a reference temperature is known, such as that of the cooled chuck 60 or that of the temperature measured locally at each thermocouple (not shown), the temperature at each Peltier element 45, 47 can be calculated from the measured thermovoltage. This arrangement provides a simpler construction than that of the arrangement described above, since the number of thermocouples required for reference temperature measurements can be less than the number of Peltier elements 45, 47.

Accordingly, the present invention provides an apparatus for controlling the temperature of a semiconductor wafer during processing. For example, the apparatus of the present invention provides a layer of thermoelectric elements for locally cooling down or locally heating up a specific area of a wafer surface during etching.

Additionally, the present invention provides a plurality of closed loops of connected Peltier elements for controlling the temperature of specific areas of a wafer during etching that is more accurate and flexible than those devices of the prior art.

Further, the apparatus of the present invention is quicker in response time for controlling the temperature of a wafer as compared to those devices of the prior art.

Finally, the present invention provides a plurality of Peltier elements for measuring the temperature profile of a wafer in-situ, which is simpler in construction than those devices of the prior art.

What is claimed is:

1. In a temperature control apparatus for single wafer etching tool of the type having a cathode electrode and chuck means for holding a wafer, the chuck means being disposed on the cathode electrode, wherein the chuck means supports the wafer at a given temperature, the improvement comprising:

a thermoelectric layer including a plurality of thermoelectric elements, said thermoelectric layer disposed between the cathode electrode and the chuck means, said thermoelectric layer comprising a plurality of closed loops, each of said closed loops connecting an amount of said plurality of thermoelectric elements, wherein each of said closed loops being arranged to correspond to a specific area of said wafer; and means coupled to each of said closed loops for providing a control voltage to each of said closed loops indicative of a given temperature;

wherein a temperature associated with each of said specific areas of said wafer being controlled by one of said closed loops.

2. The temperature control apparatus of claim 1, wherein said temperature control apparatus includes an isolation layer disposed between said thermoelectric layer and said cathode electrode.

3. The temperature control apparatus of claim 1, wherein said chuck means comprises an electrostatic chuck.

4. The temperature control apparatus of claim 1, wherein said chuck means comprises a mechanical chuck.

5. The temperature control apparatus of claim 1, wherein said chuck means comprises a vacuum chuck.

6. The temperature control apparatus of claim 1, wherein a temperature sensing means is disposed on at least one of said connected amounts of said plurality of thermoelectric elements of each of said closed loops.

7. The temperature control apparatus of claim 6, wherein said temperature sensing means is a thermocouple.

8. The temperature control apparatus of claim 6, wherein said temperature sensing means is an resistant temperature detector.

9. The temperature control apparatus of claim 6, wherein said temperature sensing means is a thermistor.

10. The temperature control apparatus of claim 1, wherein each of said at least one power means is connected to a low pass filter.

11. The temperature control apparatus of claim 1, wherein said thermoelectric layer comprises a plurality of Peltier elements.

12. The temperature control apparatus of claim 1, wherein said means for providing a control voltage to each of said closed loops comprises a plurality of voltage sources.

13. The temperature control apparatus of claim 1, wherein said thermoelectric layer comprises a center area closed loop and an outer area closed loop, wherein said center area closed loop controls a temperature associated with a center area of said wafer and wherein said outer area closed loop controls a temperature associated with an outer area of said wafer.

14. The temperature control apparatus of claim 1, wherein said temperature associated with at least one of said specific areas of said wafer is increased by a corresponding one of said closed loops.

15. The temperature control apparatus of claim 1, wherein said temperature associated with at least one of said specific areas of said wafer is decreased by a corresponding one of said closed loops.

16. The temperature control apparatus of claim 1, wherein said temperature associated with each of said specific areas of said wafer can be determined from at least one of said plurality of thermoelectric elements.

17. In a temperature control apparatus for single wafer etching tools of the type having a cathode electrode, an isolation layer, and chuck means, the isolation layer disposed on the cathode electrode and the chuck means disposed on the isolation layer, wherein the chuck means supports a wafer having a center area and an outer area, the improvement comprising:

a Peltier element layer disposed between the isolation layer and the chuck means, said Pettier element layer having two closed loops, wherein a center area closed loop connects a plurality of Peltier elements corresponding to said center area of said wafer, wherein an outer area closed loop connects a plurality of Peltier elements corresponding to said outer area of said wafer; and means coupled to each of said two closed loops for providing a control voltage to each of said two closed loops indicative of a given temperature;

wherein said center area closed loop controls a temperature associated with said center area of said wafer and wherein said outer area closed loop controls a temperature associated with said outer area of said wafer.

18. The temperature control apparatus of claim 17, wherein said temperature associated with said center area of said wafer and said temperature associated with said outer area of said wafer can be determined from at least one of said plurality of thermoelectric elements.

19. The temperature control apparatus of claim 17, wherein said Peltier element layer includes a number of Peltier elements, said plurality of Peltier elements corresponding to said center area of said wafer being at least 25% of said number of Peltier elements.

20. A temperature control apparatus for single wafer etching tools, comprising:

a chamber and a temperature control support, said temperature control support housed within said chamber, said temperature control support having a cathode electrode, an isolation layer, and chuck means, wherein said isolation layer is disposed on said cathode electrode and said chuck means is disposed on said isolation layer;

a through-hole formed within said cathode electrode, said through-hole forming part of a closed loop cooling line, said closed loop cooling line including a pump and a reservoir, wherein a coolant is pumped through said closed loop cooling line for cooling said temperature control support;

said chuck means supporting a wafer having a center area and an outer area, said center area and said outer area each having a specific temperature;

a plurality of interstices formed between said chuck means and said wafer, wherein a given mount of Helium is provided at said plurality of interstices;

a Peltier element layer disposed between the isolation layer and the chuck means, said Peltier element layer comprising two closed loops of connected Peltier elements, wherein a center area closed loop connects a plurality of Peltier elements corresponding to said center area of said wafer, wherein an outer area closed loop connects a plurality of Peltier elements corresponding to said outer area of said wafer; and means coupled to each of said two closed loops for providing a control voltage to each of said two closed loops indicative of a given temperature;

wherein said center area closed loop controls said temperature of said center area of said wafer and wherein said outer area closed loop controls said temperature of said outer area of said wafer.

* * * * *